United States Patent
Yoshikawa et al.

(10) Patent No.: US 9,825,145 B2
(45) Date of Patent: Nov. 21, 2017

(54) METHOD OF MANUFACTURING SILICON CARBIDE SEMICONDUCTOR DEVICE INCLUDING FORMING AN ELECTRIC FIELD CONTROL REGION BY A LASER DOPING TECHNOLOGY

(71) Applicant: FUJI ELECTRIC CO., LTD., Kanagawa (JP)

(72) Inventors: Koh Yoshikawa, Matsumoto (JP); Haruo Nakazawa, Matsumoto (JP); Kenichi Iguchi, Matsumoto (JP); Yasukazu Seki, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/067,115

(22) Filed: Mar. 10, 2016

(65) Prior Publication Data

US 2016/0315169 A1    Oct. 27, 2016

(30) Foreign Application Priority Data

Apr. 24, 2015   (JP) .................................. 2015-089132

(51) Int. Cl.
*H01L 21/04* (2006.01)
*H01L 21/268* (2006.01)
(Continued)

(52) U.S. Cl.
CPC ...... *H01L 29/6603* (2013.01); *H01L 21/0455* (2013.01); *H01L 21/0495* (2013.01);
(Continued)

(58) Field of Classification Search
None
See application file for complete search history.

(56) References Cited

U.S. PATENT DOCUMENTS

2005/0176182 A1*  8/2005  Me .......................... H01L 27/12
                                                         438/149
2008/0277668 A1* 11/2008  Okuno ................ H01L 29/0692
                                                         257/77
(Continued)

FOREIGN PATENT DOCUMENTS

JP      H8-148443 A      6/1996
JP      H8-264468 A     10/1996
(Continued)

OTHER PUBLICATIONS

Oyo Buturi, vol. 70, No. 2 (2001), pp. 188-190.

*Primary Examiner* — Jay C Chang (57) ABSTRACT

When p-type impurities are implanted into a SiC substrate using a laser, controlling the concentration is difficult. A p-type impurity region is formed by a laser in a region where the control of the concentration in the SiC substrate is not necessary almost at all. A SiC semiconductor device having withstanding high voltage is manufactured at a lower temperature process compared to ion implantation process. A method of manufacturing a silicon carbide semiconductor device includes forming, on one main surface of a first conductivity-type silicon carbide substrate, a first conductivity-type drift layer having a lower concentration than that of the silicon carbide substrate; forming, on a front surface side of the drift layer, a second conductivity-type electric field control region by a laser doping technology; forming a Schottky electrode in contact with the drift layer; and forming, on the other main surface of the silicon carbide substrate, a cathode electrode.

15 Claims, 12 Drawing Sheets

(51) Int. Cl.
- *H01L 29/16* (2006.01)
- *H01L 29/872* (2006.01)
- *H01L 29/47* (2006.01)
- *H01L 29/06* (2006.01)
- *H01L 29/66* (2006.01)
- *H01L 29/167* (2006.01)

(52) U.S. Cl.
CPC ........ *H01L 21/268* (2013.01); *H01L 29/0623* (2013.01); *H01L 29/167* (2013.01); *H01L 29/1608* (2013.01); *H01L 29/47* (2013.01); *H01L 29/872* (2013.01)

(56) References Cited

U.S. PATENT DOCUMENTS

| | | | | |
|---|---|---|---|---|
| 2011/0275174 A1* | 11/2011 | Quick | ................ | H01L 21/0455 438/45 |
| 2013/0062723 A1* | 3/2013 | Henning | ............. | H01L 29/8611 257/484 |
| 2013/0285070 A1 | 10/2013 | Kawai et al. | | |

FOREIGN PATENT DOCUMENTS

| | | | |
|---|---|---|---|
| JP | 2000-277448 | A | 10/2000 |
| JP | 2004-158702 | A | 6/2004 |
| JP | 2007-227655 | A | 9/2007 |
| JP | 2013-232553 | A | 11/2013 |

* cited by examiner

FIG.8

METHOD OF MANUFACTURING SILICON CARBIDE SEMICONDUCTOR DEVICE INCLUDING FORMING AN ELECTRIC FIELD CONTROL REGION BY A LASER DOPING TECHNOLOGY

The contents of the following Japanese patent application are incorporated herein by reference:
NO. 2015-089132 filed on Apr. 24, 2015.

BACKGROUND

1. Technical Field

The present invention relates to a method of manufacturing a silicon carbide semiconductor device.

2. Related Art

Conventionally, it is known that p-type impurities are implanted over the entire front surface of a silicon carbide (hereinafter described as "SiC") substrate by ion implantation (for example, see Patent Documents 1 to 4). Moreover, it is known that the p-type impurities are implanted over the entire front surface of the SiC substrate using a laser (for example, see Patent Documents 5 and 6, and Non-Patent Document 1).

PRIOR ART DOCUMENTS

Patent Document 1: Japanese Patent Application Publication No. 2007-227655
Patent Document 2: Japanese Patent Application Publication No. 2000-277448
Patent Document 3: Japanese Patent Application Publication No. H8-148443
Patent Document 4: Japanese Patent Application Publication No. 2013-232553
Patent Document 5: Japanese Patent Application Publication No. H8-264468
Patent Document 6: Japanese Patent Application Publication No. 2004-158702
Non-Patent Publication 1: OYO BUTURI, Vol. 70, No. 2 (2001), pp. 188-190

By using the laser, it is possible to implant the p-type impurities into the SiC substrate at a lower temperature process compared to ion implantation. However, in a case where the p-type impurities are implanted into the SiC substrate using the laser, it is difficult to control the impurity concentration.

SUMMARY

In a first aspect of the present invention, a method of manufacturing a silicon carbide semiconductor device is provided, the method including: forming, on one main surface of a first conductivity-type silicon carbide substrate, a first conductivity-type drift layer having a lower concentration than that of the silicon carbide substrate; forming, on a front surface side of the drift layer, a second conductivity-type electric field control region by a laser doping technology; forming a Schottky electrode in contact with the drift layer; and forming, on the other main surface of the silicon carbide substrate, a cathode electrode.

The second conductivity-type electric field control region may include a ring-shaped electric field relaxation region formed at an outer circumferential portion in a region where the drift layer and the Schottky electrode contact with each other.

The second conductivity-type electric field control region may include a plurality of junction barrier regions selectively formed on the inner circumferential side of the electric field relaxation region.

The second conductivity-type electric field control region may include one or more field limiting rings provided on the outer circumferential side of the ring-shaped electric field relaxation region.

The method may further include forming one or more trenches after the formation of the first conductivity-type drift layer and before the formation of the electric field control region. The one or more field limiting rings may be formed below the one or more trenches.

The second conductivity-type electric field control region may include a ring-shaped channel stopper region provided on the outer circumferential side of the one or more field limiting rings. The method may further include: forming an insulating film in contact with the drift layer; forming a channel stopper electrode in contact with the channel stopper region and the insulating film after the formation of the insulating film; and forming an anode electrode in contact with the Schottky electrode after the formation of the Schottky electrode. A region between the channel stopper electrode and the anode electrode may be covered by the insulating film.

The method may further include forming a field plate electrode connected to the one or more field limiting rings.

The method may further include: forming an ohmic electrode which has an ohmic connection to the plurality of selectively formed junction barrier regions; and forming an anode electrode in contact with the Schottky electrode and the ohmic electrode after the formation of the ohmic electrode.

The Schottky electrode and the ohmic electrode may be the same material. The ohmic electrode and the anode electrode may be the same material.

The formation of the second conductivity-type electric field control region by the laser doping technology may have: forming a mask layer having a plurality of openings on the drift layer; and implanting aluminum into the drift layer through the plurality of openings by irradiating the drift layer with a laser in a state where the drift layer is exposed to a gas containing aluminum.

The formation of the second conductivity-type electric field control region by the laser doping technology may have: depositing an aluminum layer onto the drift layer; forming a plurality of patterns by patterning the aluminum layer; and implanting aluminum into the drift layer through the plurality of patterns by irradiating the plurality of patterns with the laser.

The formation of the second conductivity-type electric field control region by the laser doping technology may further have removing the plurality of patterns.

A laser light source in the laser doping technology in the formation of the electric field control region may be any of KrF, ArF, XeF, XeCl, and YAG3ω.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential in means provided by aspects of the invention.

Figure 1:
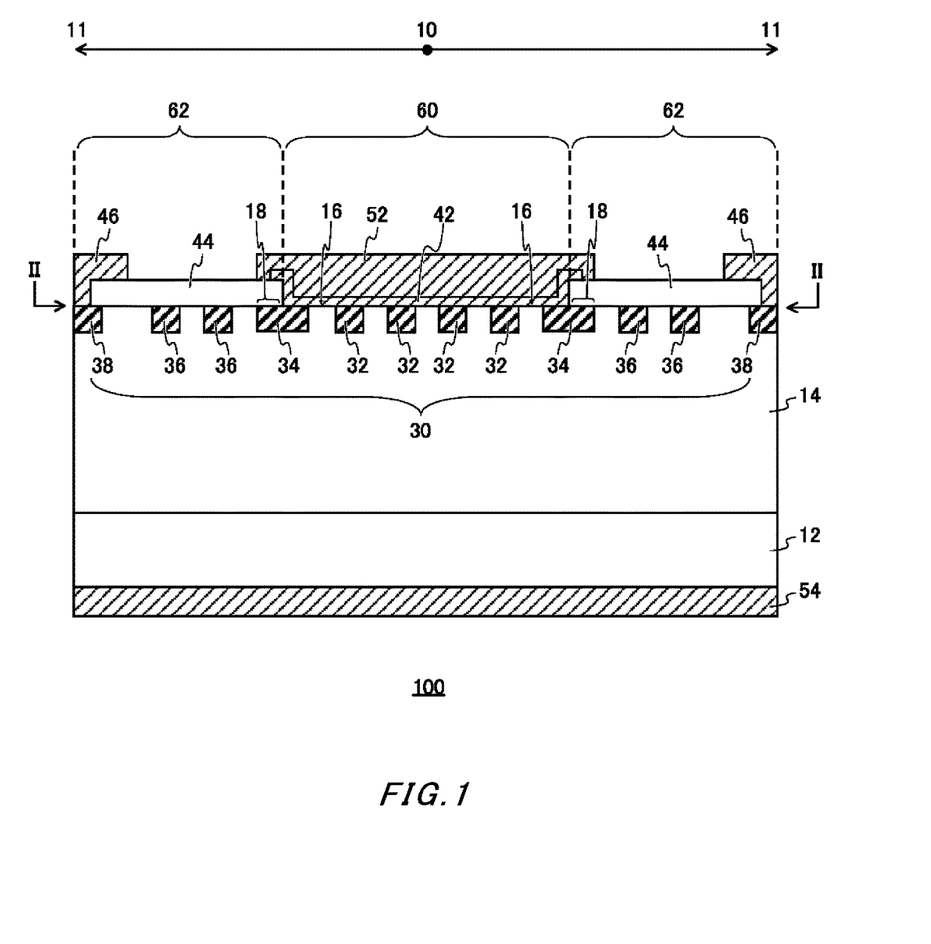
FIG. 1 is a cross-sectional view of a SiC-SBD 100 according to a first embodiment.

FIG. 1 is a cross-sectional view of a SiC-SBD 100 according to a first embodiment. The SiC-SBD means a SiC Schottky barrier diode. The SiC-SBD 100 of this example has a SiC substrate 12 and a drift layer 14. The SiC-SBD 100 has a Schottky electrode 42, an anode electrode 52, an insulating film 44, and a channel stopper electrode 46 on a front surface side of the drift layer 14, and has a cathode electrode 54 on a back surface side of the SiC substrate 12.

The SiC substrate 12 has first conductivity-type impurities, and the first conductivity-type is an n-type in this example. The drift layer 14 is a SiC epitaxial layer formed on one main surface of the SiC substrate 12 by an epitaxial method. In this example, the one main surface of the SiC substrate 12 is on the front surface side of the SiC-SBD 100. The drift layer 14 is an n⁻-type layer which has first conductivity-type impurities having a lower concentration than that of the SiC substrate 12.

The drift layer 14 has an electric field control region 30 on its front surface side. The electric field control region 30 has a second conductivity-type, in which the second conductivity-type is a p-type of high concentration in this example. The electric field control region 30 is a region formed by a laser doping technology. The electric field control region 30 includes a junction barrier region 32, an electric field relaxation region 34, a field limiting ring 36, and a channel stopper region 38.

In the current laser doping technology, it is difficult to control the impurity concentration when a p-type region of high concentration is formed on a SiC layer. Therefore, it is difficult to create, utilizing the laser doping technology, a merged pin Schottky barrier diode, a pin diode, or the like, in which most of the current flows through a PN junction during operation. In addition, it is also difficult to create, utilizing the laser doping technology, structures including a JTE (Junction Termination Extension) structure and a RESURF (Reduced Surface Field) structure, or the like, which require the control of the p-type impurity concentration. Therefore, the above-mentioned diodes and structures are not included in the present invention.

It is preferable to apply the laser doping technology to a region where the control of the p-type impurity concentration is not necessary almost at all. For example, as the diode structure, SBD and JBS (Junction Barrier Schottky) diodes in which most of the currents during operation flow through a Schottky junction between metal and n-type SiC are preferable. Moreover, the preferred structure as a withstanding voltage structure includes a structure of the field limiting ring 36 in which the control of the p-type impurity concentration is not necessary almost at all, a structure combining the field limiting ring 36 and a field plate, a channel stopper structure in which the insulating film is provided between the anode electrode 52 and the channel stopper electrode 46, or the like.

The electric field relaxation region 34 is formed in a region on the outermost circumferential side of a contact region 16 where the drift layer 14 and the Schottky electrode 42 contact with each other, and at an outer circumferential portion 18 which is a region on the outer circumferential side of the contact region 16. In the present specification, the side closer to a central portion 10 of an active portion 60 is referred to as an inner circumferential side, and the side closer to an end portion 11 of the SiC-SBD 100 is referred to as an outer circumferential side. The electric field relaxation region 34 may define a boundary between the active portion 60 and a withstanding voltage structure portion 62.

The electric field relaxation region 34 forms a PN junction with the drift layer 14. When high voltage is applied to the SiC-SBD 100, a depletion layer formed at the junction interface between the drift layer 14 and the Schottky electrode 42 is connected to a depletion layer formed at the interface of the PN junction between the drift layer 14 and the electric field relaxation region 34. Thereby, the depletion layer can expand from the active portion 60 to the withstanding voltage structure portion 62 on the outer circumferential side. Therefore, because the electric field concentration during application of high voltage is reduced, withstanding voltage of the SiC-SBD 100 is improved.

The junction barrier region 32 is positioned in the active portion 60. The junction barrier region 32 is a region which is selectively formed on the inner circumferential side of the electric field relaxation region 34. The phrase "selectively formed" means being formed with a specific shape in the active portion 60. The junction barrier region 32 of this example has a rectangular shape having a longitudinal portion in a direction perpendicular to the plane of the drawing. A plurality of the junction barrier regions 32 is provided in parallel with and apart from the direction of the longitudinal portion.

The junction barrier region 32 forms a PN junction with the drift layer 14, similar to the electric field relaxation region 34. Thereby, because it is possible to expand the depletion layer over the entire active portion 60 during application of high voltage, withstanding voltage of the SiC-SBD 100 is improved.

The field limiting ring 36 is a region provided on the outer circumferential side of the electric field relaxation region 34. One or more field limiting rings 36 are provided apart from each other. The field limiting ring 36 also forms a PN junction with the drift layer 14, similar to the electric field relaxation region 34. Thereby, because it is possible to expand the depletion layer to the withstanding voltage structure portion 62 during application of high voltage, withstanding voltage of the SiC-SBD 100 is improved.

The insulating film 44 is provided in contact with the one or more field limiting rings 36 of the drift layer 14. Although the insulating film 44 of this example is a silicon oxide ($SiO_2$) film, different insulating films may be used. The inner circumferential side of the insulating film 44 is provided between the electric field relaxation region 34 and the Schottky electrode 42, and the outer circumferential side thereof is provided between the channel stopper region 38 and the channel stopper electrode 46. A region between the channel stopper electrode 46 and the anode electrode 52 is covered by the insulating film 44.

The channel stopper region 38 is provided on the outer circumferential side of the field limiting ring 36. The channel stopper region 38 of this example is provided in contact with the end portion 11 located on the outermost circumferential side of the SiC-SBD 100. The channel stopper region 38 has a function of reducing contact resistance with the channel stopper electrode 46.

The channel stopper electrode 46 is in contact with the channel stopper region 38 and the insulating film 44. The channel stopper electrode 46 has at the same electrical potential as the cathode electrode 54 via the end portion 11 of the SiC substrate 12 and the drift layer 14, and the channel stopper region 38. In the end portion 11 of the SiC substrate 12 and the drift layer 14, defects caused by dicing become a carrier, and thus the end portion 11 has conductivity. The channel stopper electrode 46 and the cathode electrode 54 are at the same potential when reverse voltage is applied to the SiC-SBD 100, and an extension of the depletion layer in the end portion on the inner circumferential side of the channel stopper electrode 46 is restricted. Therefore, because the depletion layer does not extend to the end portion 11 during application of the reverse voltage, it is possible to maintain withstanding voltage.

The Schottky electrode 42 forms a Schottky junction with the drift layer 14 excluding the electric field control region 30 in the active portion 60. The anode electrode 52 is provided in contact with the Schottky electrode 42. Moreover, the cathode electrode 54 is provided on the back surface of the SiC substrate 12.

Figure 2:
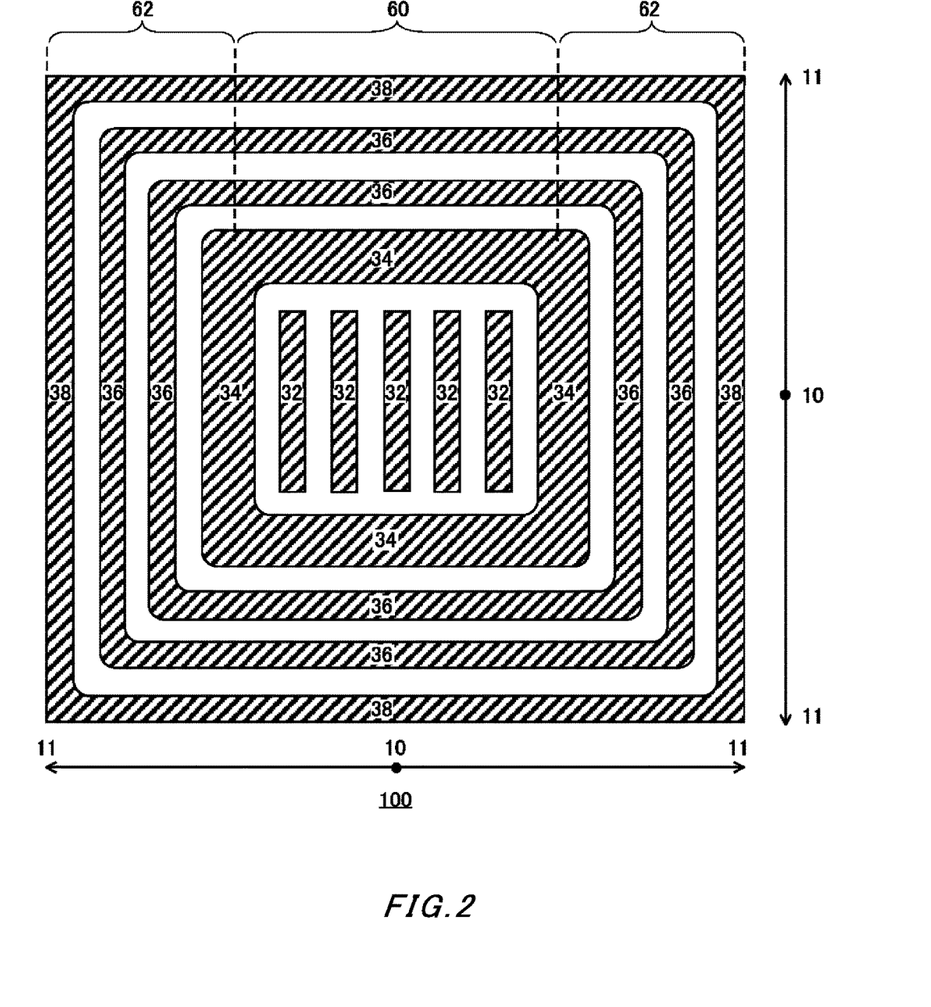
FIG. 2 is a top plan view illustrating the SiC-SBD 100.

FIG. 2 is a top plan view of the SiC-SBD 100. FIG. 2 is a view illustrating a front surface side seen from the position of II-II shown in FIG. 1. The Schottky electrode 42, the insulating film 44, the channel stopper electrode 46, and the anode electrode 52 are omitted in FIG. 2.

As mentioned above, the junction barrier region 32 is a rectangular-shaped region having its longitudinal portion in a predetermined direction. The electric field relaxation region 34 is a ring-shaped region surrounding the plurality of junction barrier regions 32 in the active portion 60. The one or more field limiting rings 36 are provided on the outer circumferential side of the electric field relaxation region 34, and the channel stopper region 38 is provided on the outer circumferential side of the one or more field limiting rings 36. Both the field limiting ring 36 and the channel stopper region 38 are ring-shaped regions provided in the withstanding voltage structure portion 62.

Figure 3:
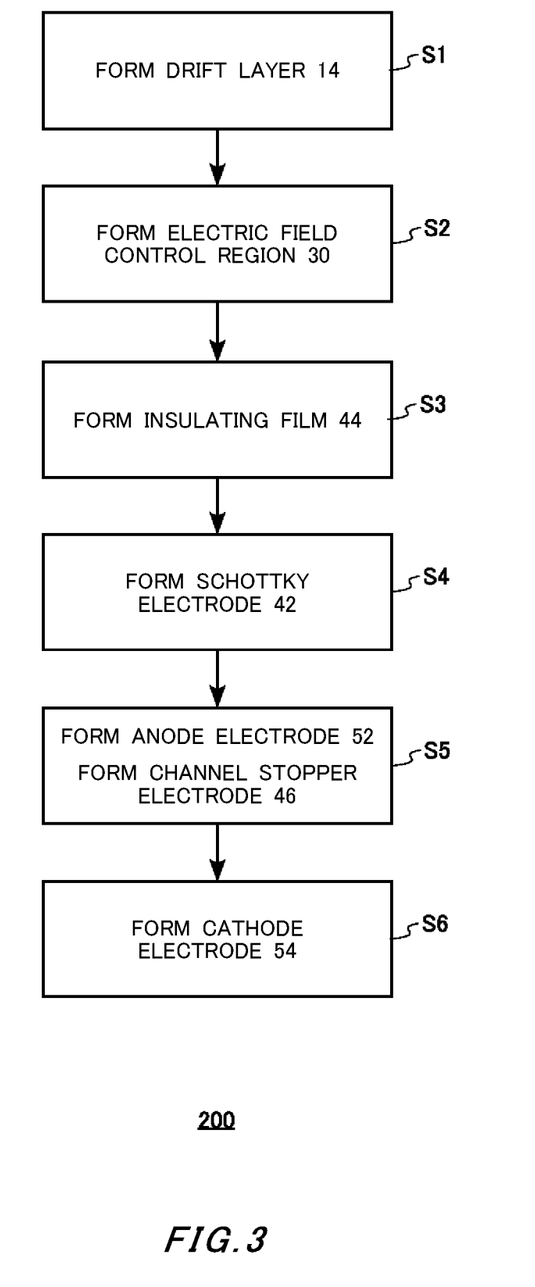
FIG. 3 is a view illustrating a manufacturing flow 200 of the SiC-SBD 100.

FIG. 3 is a view illustrating a manufacturing flow 200 of the SiC-SBD 100. The manufacturing flow 200 of this example has steps S1 to S6. In step S1, the first conductivity-type drift layer 14 having a lower concentration than that of the SiC substrate 12 is formed on the front surface of the first conductivity-type SiC substrate 12. The drift layer 14 may be formed by an epitaxial method. In order to obtain the SiC-SBD 100 kV of class high withstanding voltage, the thickness of the drift layer 14 may be 5 μm or more and 60 μm or less, and the impurity concentration may be $1E14$ $cm^{-3}$ or more and $1E16$ $cm^{-3}$ or less. E means multiplication by 10 raised to a certain power. For example, E14 means 10 to the 14th power.

In step S2, the second conductivity-type electric field control region 30 is formed on the front surface side of the drift layer 14 by the laser doping technology. As mentioned above, the electric field control region 30 includes an electric field relaxation region, a junction barrier region, a field limiting ring, and a channel stopper region. The concentration of the second conductivity-type impurities may be $1E20$ $cm^{-3}$ or more and $1E21$ $cm^{-3}$ or less. Details of the laser doping technology will be described later in FIGS. 4A to 4D, and FIGS. 5A to 5D.

In step S3, the insulating film 44 is formed in contact with the drift layer 14 of the withstanding voltage structure portion 62. In step S4, the Schottky electrode 42 is formed in contact with the drift layer 14 of the active portion 60. The Schottky electrode 42 is, for example, gold (Au), nickel (Ni), titanium (Ti), molybdenum (Mo), or the like.

In step S5, the channel stopper electrode 46 in contact with the channel stopper region 38 and the insulating film 44, and the anode electrode 52 in contact with the Schottky electrode 42 are formed. By sputtering Ni for the channel stopper electrode 46, and sputtering Ni, aluminum (Al) or Al—Si alloy for the anode electrode 52, and by patterning the sputtered metals, the channel stopper electrode 46 and the anode electrode 52 are formed. In step S6, the cathode electrode 54 is formed on the back surface of the SiC substrate 12. For example, the cathode electrode 54 is formed by sputtering Ni and Au in this order.

Figure 4A:
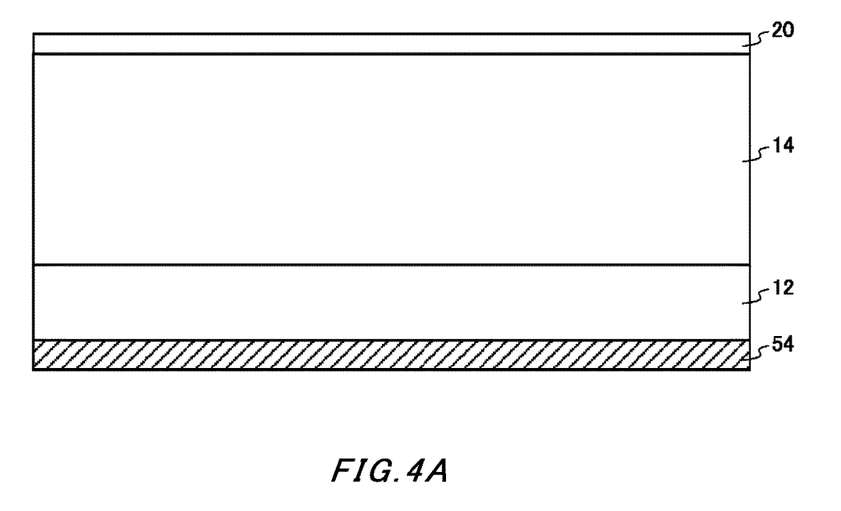
FIG. 4A is a view illustrating formation of a mask layer 20 in contact with a drift layer 14.

FIGS. 4A to 4D are views illustrating examples of vapor phase laser doping. FIGS. 4A to 4D correspond to formation of the electric field control region 30 (step S2 of FIG. 3). FIG. 4A is a view illustrating formation of a mask layer 20 in contact with the drift layer 14. The mask layer 20 may be silicon carbide. For example, the silicon carbide is formed by plasma CVD using tetramethoxysilane gas and oxygen gas.

Figure 4B:
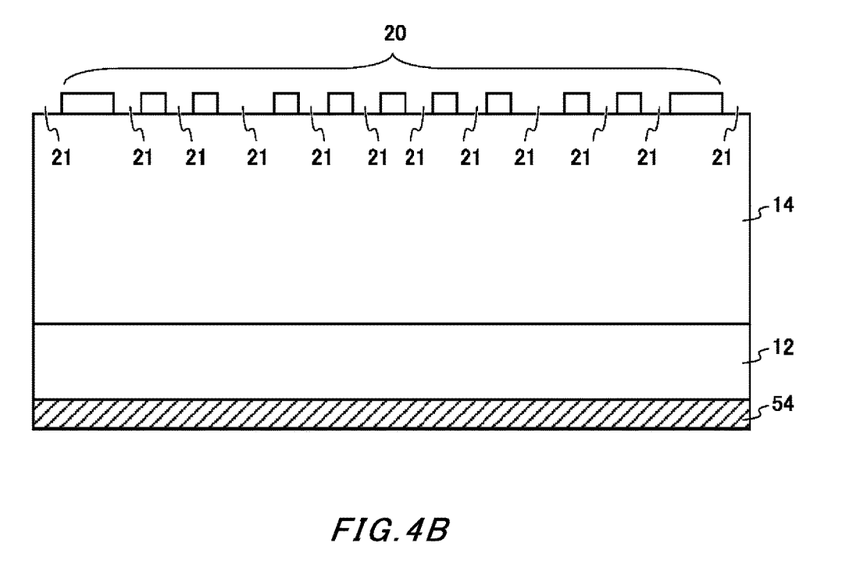
FIG. 4B is a view illustrating formation of a plurality of openings 21 in a mask layer 20.

FIG. 4B is a view illustrating formation of a plurality of openings 21 in the mask layer 20. The mask layer 20 is patterned by applying the known photolithography and etching, and thereby the plurality of openings 21 is formed.

Figure 4C:
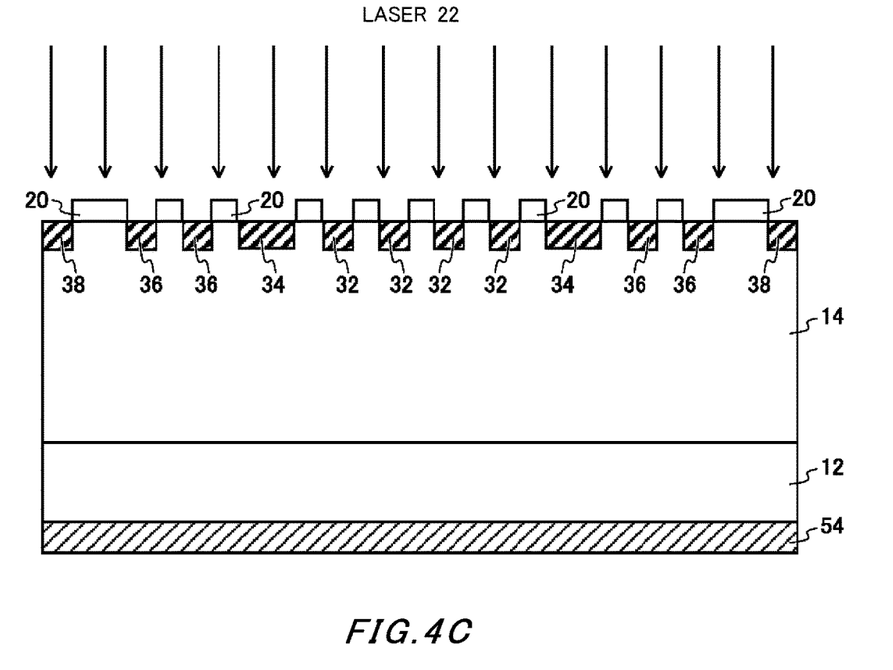
FIG. 4C is a view illustrating implantation of aluminum into the drift layer 14 by irradiation with a laser 22.

FIG. 4C is a view illustrating implantation of Al into the drift layer 14 by irradiation with a laser 22. In this example, the drift layer 14 is irradiated with the laser 22 in a state where the drift layer 14 is exposed to a gas containing hydrogen ($H_2$) and trimethylaluminum (($CH_3$)$_3$Al). In this example, the drift layer 14 is irradiated with 4,000 shots of the laser 22 having energy of approximately 1.5 J/cm$^2$. Thereby, Al is implanted into the drift layer 14 through the plurality of openings 21. As a laser light source of the laser 22, any of KrF, ArF, XeF, XeCl, and YAG3ω may be used. Moreover, the SiC substrate may be heated as necessary.

Figure 4D:
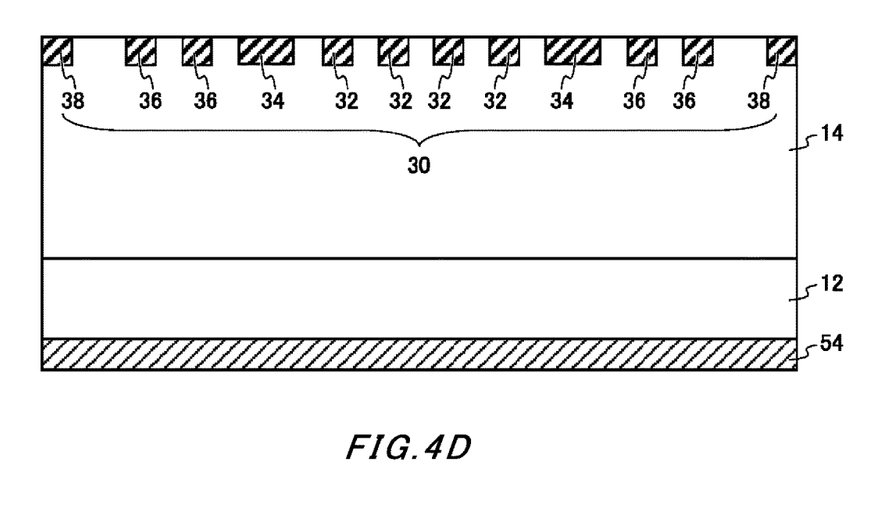
FIG. 4D is a view illustrating a state after the mask layer 20 is removed.

FIG. 4D is a view illustrating a state after the mask layer 20 is removed. Thereby, because the electric field control region 30 is completed, step S3 and the following steps of step S3 in FIG. 3 may be performed. In this example, because the electric field control region 30 is formed by the laser doping technology, the p-type impurity region of the SiC-SBD 100 can be formed by a low temperature process without a thermal annealing step at a temperature of 1,500° C. or higher after ion implantation. As mentioned above, although it is difficult to control the impurity concentration in the laser doping technology, the laser doping technology is applied to form the electric field control region 30 where the control of the impurity concentration is not necessary almost at all, and thus it is possible to manufacture the SiC-SBD 100 having withstanding high voltage even by utilizing the laser doping technology.

Figure 5A:
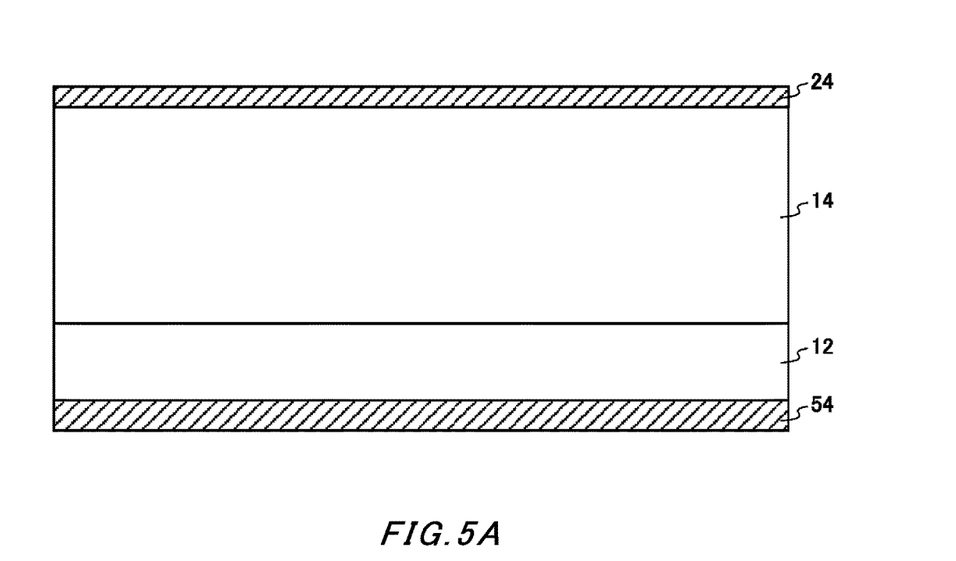
FIG. 5A is a view illustrating deposition of an Al layer 24.

FIGS. 5A to 5D are views illustrating examples of solid phase laser doping. FIGS. 5A to 5D are another example of formation of the electric field control region 30 (step S2 of FIG. 3). FIG. 5A is a view illustrating deposition of an Al layer 24. For example, the Al layer 24 is deposited by the thickness of 200 nm in contact with the drift layer 14 by sputtering Al.

Figure 5B:
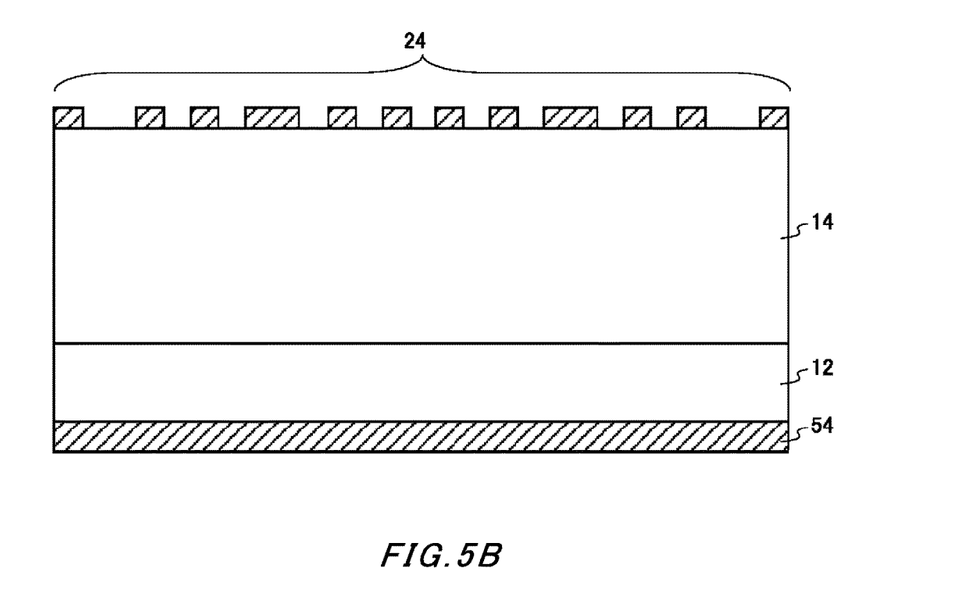
FIG. 5B is a view illustrating formation of a plurality of patterns in the Al layer 24.

FIG. 5B is a view illustrating formation of a plurality of patterns in the Al layer 24. The plurality of patterns may be formed by applying the known photolithography and etching, and patterning the Al layer 24. In this example, the plurality of patterns of the Al layer 24 corresponds to the shapes of the top plan view of the electric field control region 30. That is, the plurality of patterns has the same patterns as the rectangular shape of the junction barrier region 32, and the ring shape of the electric field relaxation region 34, the field limiting ring 36, and the channel stopper region 38, as shown in FIG. 2.

Figure 5C:
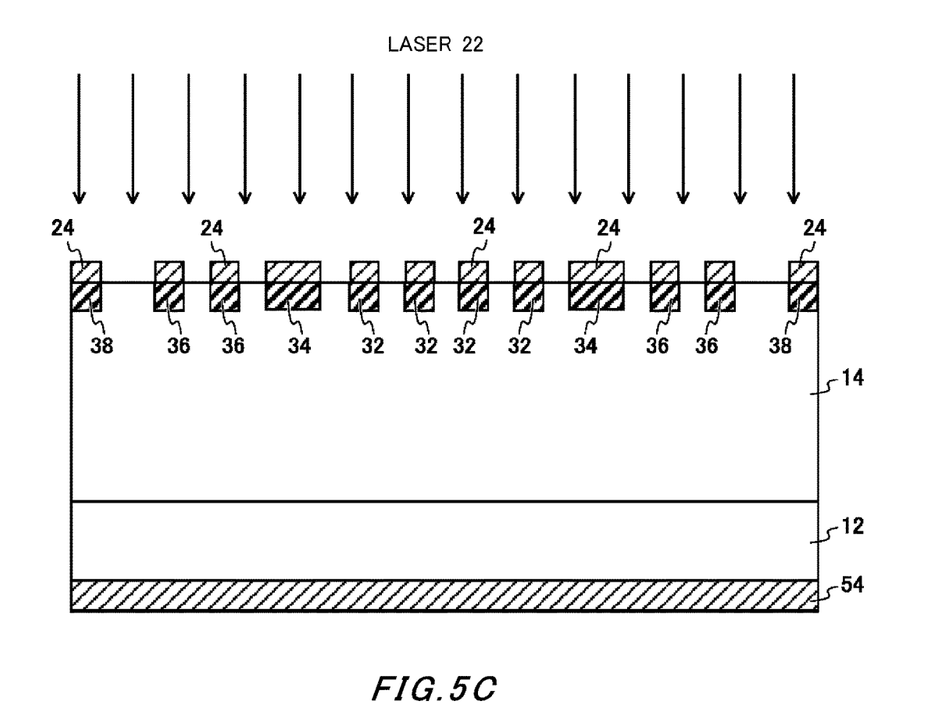
FIG. 5C is a view illustrating implantation of aluminum into the drift layer 14 by irradiation with the laser 22.

FIG. 5C is a view illustrating implantation of Al into the drift layer 14 by irradiation with the laser 22. The plurality of patterns of the Al layer 24 is irradiated with the laser 22. In this example, the plurality of patterns is irradiated with 1 shot of the laser 22 having energy of approximately 3.5 J/cm$^2$. Thereby, Al is implanted into the drift layer 14 through the plurality of patterns. As the laser light source of the laser 22, the same light source as that of the example of the vapor phase laser doping may be used. Moreover, the SiC substrate may be heated as necessary.

Figure 5D:
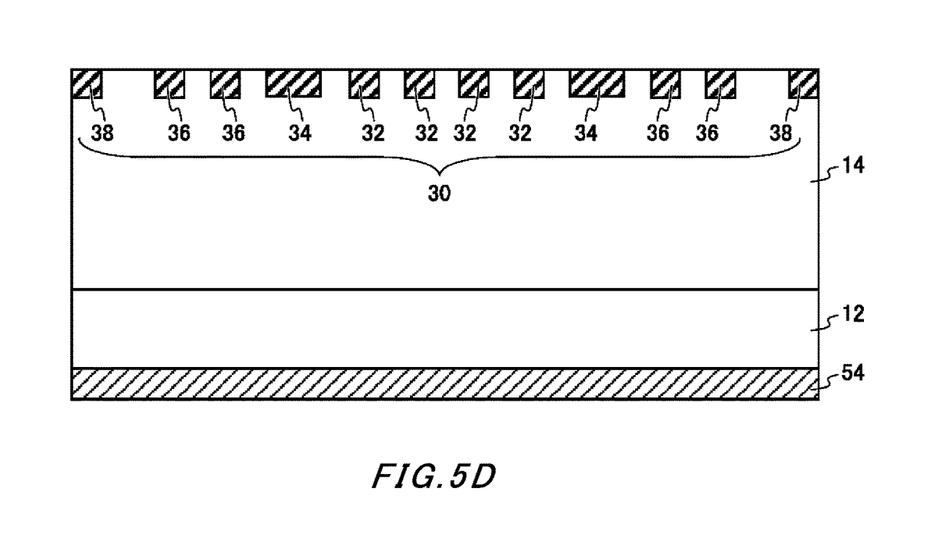
FIG. 5D is a view illustrating a state after the plurality of patterns of the Al layer 24 is removed.

FIG. 5D is a view illustrating a state after the plurality of patterns of the Al layer 24 is removed. Thereby, the electric field control region 30 is completed, and thus step S3 and the following steps of step S3 in FIG. 3 may be performed. Also, in the example of solid phase laser doping, it is possible to obtain the same effect as that of the example of vapor phase laser doping.

Figure 6:
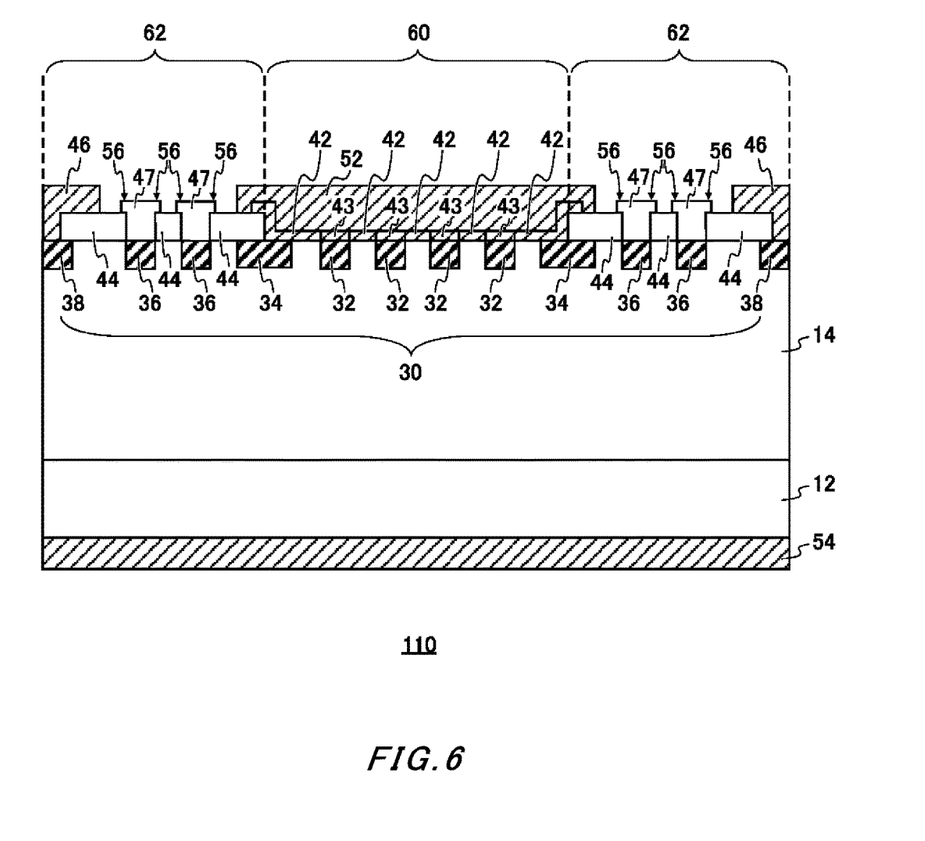
FIG. 6 is a cross-sectional view of a SiC-SBD 110 according to a second embodiment.

FIG. 6 is a cross-sectional view of a SiC-SBD 110 according to a second embodiment. This example differs from the first embodiment in that it has an ohmic electrode 43 which has an ohmic connection to the junction barrier region 32, and a field plate electrode 47 connected to the field limiting ring 36. This embodiment is the same as the first embodiment in all other points.

In the manufacturing flow of this example, immediately after the formation of the insulating film 44 (step S3 of FIG. 3), an opening is provided in a portion of the insulating film 44 contacting the field limiting ring 36. Thereby, the field limiting ring 36 is open to the outside without being covered by the insulating film 44. After that, the field plate electrode 47 connected to the field limiting ring 36 is formed.

Moreover, in the manufacturing flow of this example, immediately before or after the formation of the Schottky electrode 42 (step S4 of FIG. 3), the ohmic electrode 43 which has an ohmic connection to the plurality of junction barrier regions 32 is formed. As a variation, the Schottky electrode 42 and the ohmic electrode 43 may be formed with the same material simultaneously. In one example, both the Schottky electrode 42 and the ohmic electrode 43 may be Ni. As a further variation, the field plate electrode 47, the Schottky electrode 42, and the ohmic electrode 43 may be formed with the same material simultaneously.

Moreover, after the Schottky electrode 42 and the ohmic electrode 43 are formed, the anode electrode is formed in contact with both the electrodes. The ohmic electrode 43 and the anode electrode 52 may be formed of the same material. In one example, both of them may be Ni.

In this example, the ohmic electrode 43 and the junction barrier region 32 are electrically connected. Thereby, when overvoltage is applied in the forward direction of the SiC-SBD 110, it is possible to lower forward voltage by implanting minority carriers (electrons in this example) into the drift layer 14 from the junction barrier region 32. Therefore, it is possible to improve surge withstand. Moreover, in this example, the field plate electrode 47 and the field limiting ring 36 are electrically connected. The field plate electrode 47 has an overlapping region 56 which overlaps the drift layer 14 via the insulating film 44. Because the overlapping region 56 functions as a MOS structure, it is possible to control how the depletion layer is extended in the drift layer 14. Although this example is an example in which the ohmic electrode 43 and the field plate electrode 47 are applied to the first embodiment, either one of the ohmic electrode 43 and the field plate electrode 47 may be applied to the first embodiment.

Figure 7A:
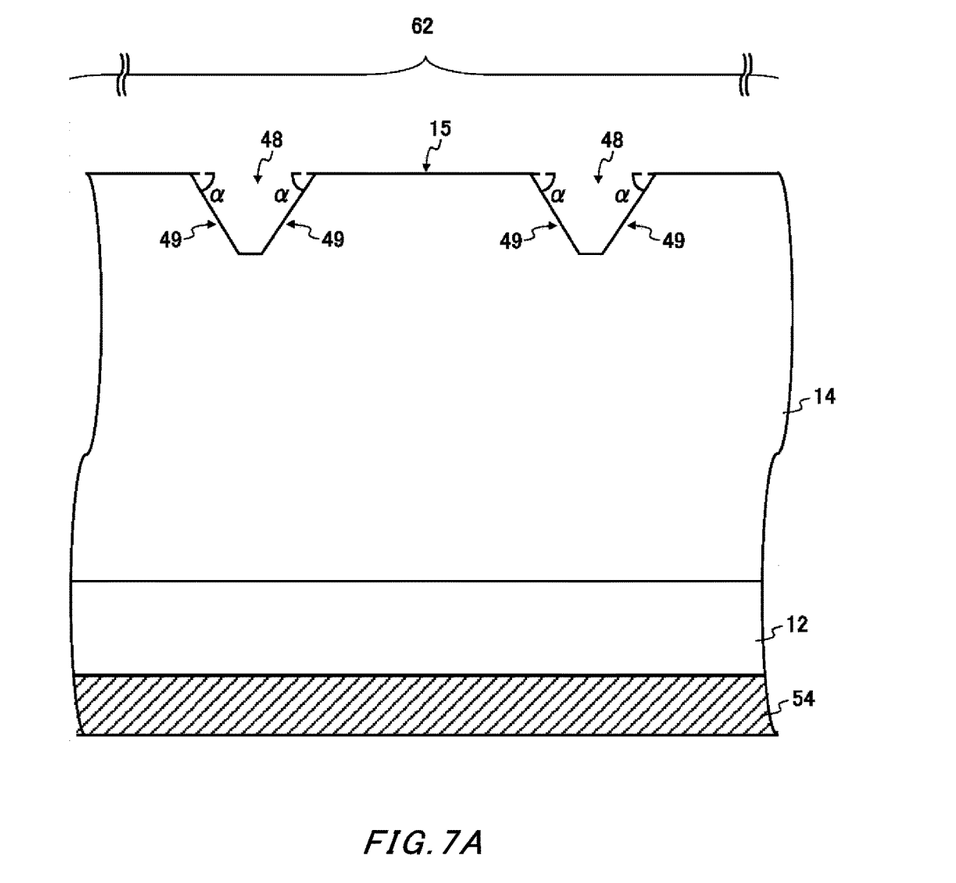
FIG. 7A is a view illustrating formation of a trench 48 in a withstanding voltage structure portion 62.
Figure 7B:
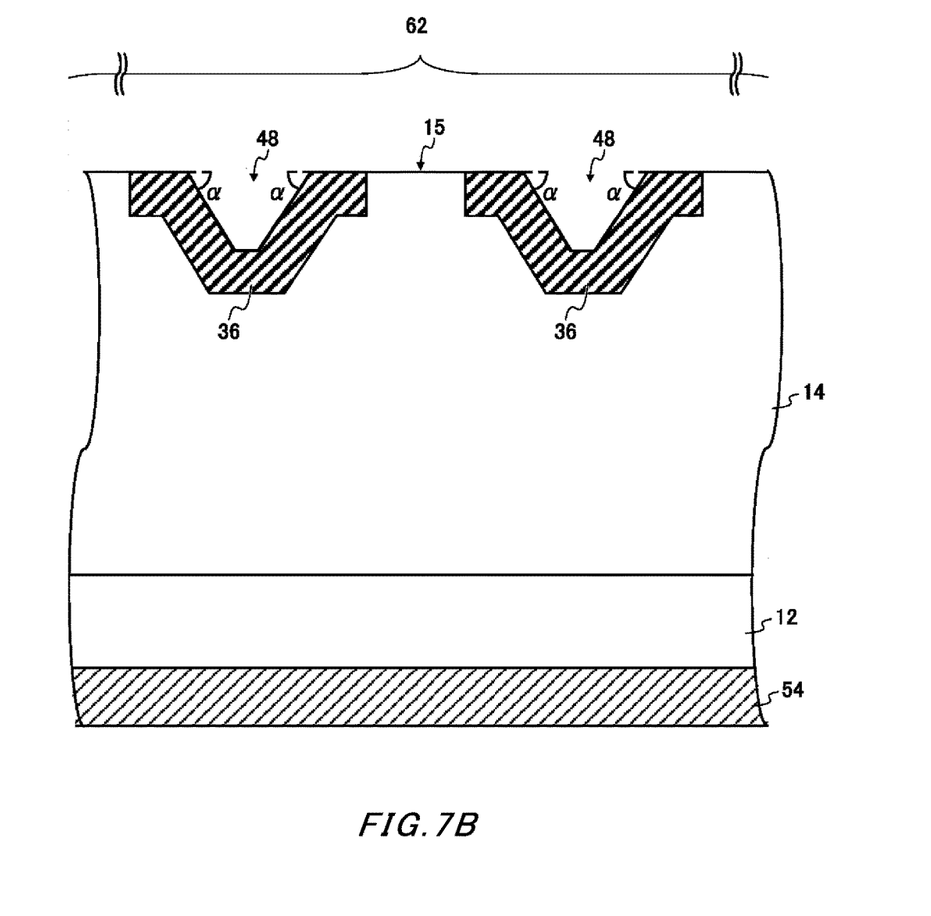
FIG. 7B is a view illustrating formation of a field limiting ring 36 below the trench 48.
Figure 7C:
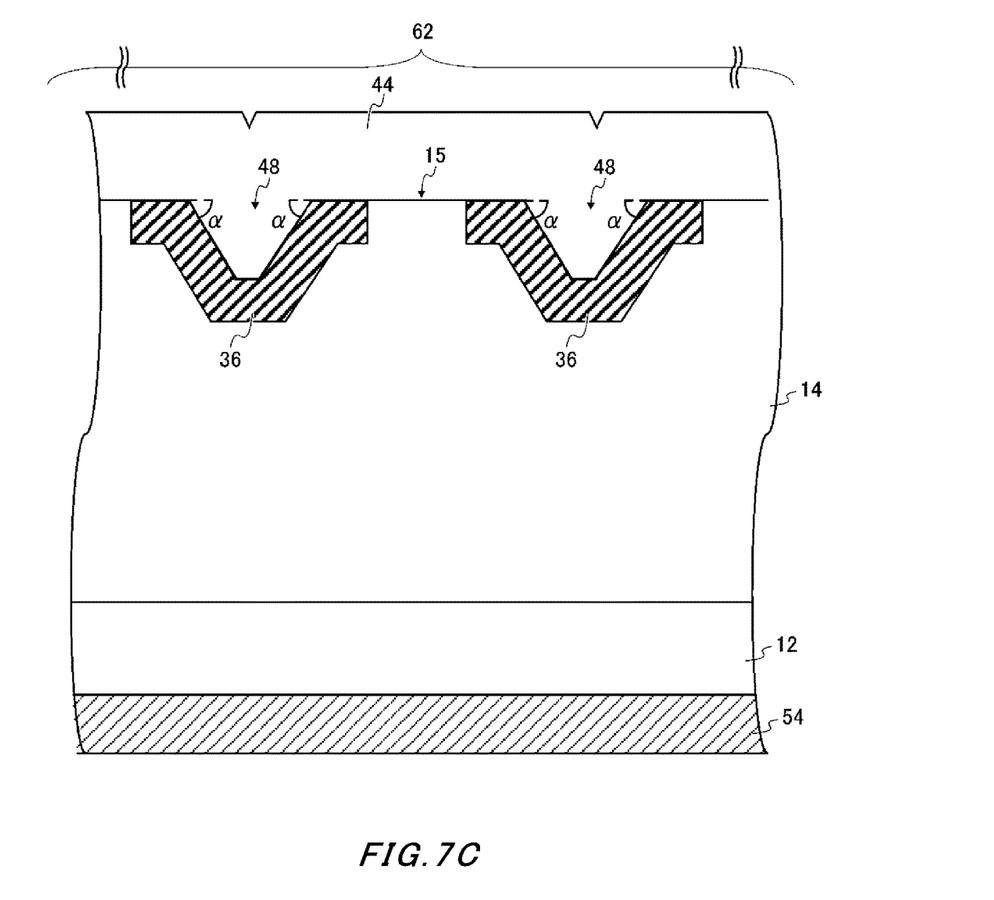
FIG. 7C is a view illustrating formation of an insulating film 44 in the withstanding voltage structure portion 62.

FIGS. 7A to 7C are views illustrating examples of forming the field limiting ring 36 below a trench 48. FIG. 7A is a view illustrating formation of the trench 48 in the withstanding voltage structure portion 62. This formation is performed after the formation of the drift layer 14 (step S1 of FIG. 3) and before the formation of the electric field control region 30 (step S2 of FIG. 3).

The trench 48 can be formed by applying the known photolithography and etching. The trench 48 of this example has a depth of 1 μm from the front surface 15 of the drift layer 14 to the bottom of the trench 48. The depth of 1 μm is merely an example, and the depth may be appropriately changed according to the intended performance of the semiconductor device. In this example, the trench 48 is formed such that a side wall 49 of the trench 48 and the front surface 15 of the drift layer 14 form an angle α. In the vapor phase laser doping of FIGS. 4A to 4D and the solid phase laser doping of FIGS. 5A to 5D, p-type impurity Al is diffused to the back surface side of the drift layer 14 from its front surface side. Therefore, the smaller the angle α, the easier to form the p-type impurity region of high concentration on the side wall 49. The angle α may be 30 degrees or more and 80 degree or less, and more preferably, 55 degrees or more and 75 degrees or less.

FIG. 7B is a view illustrating formation of the field limiting ring 36 below the trench 48. This formation corresponds to forming the electric field control region 30 (step S2 of FIG. 3). Because the bottom of the field limiting ring 36 of this example is deeper than those in the first and second embodiments (that is, it is positioned on the back surface side), it is possible to form the depletion layer at a deeper position. Moreover, it is easier for the depletion layer to expand from the side wall 49 to the inner circumferential side and the outer circumferential side. Therefore, compared to the first and second embodiments, it is possible to obtain a higher electric field shielding effect and a higher electric field relaxation effect.

FIG. 7C is a view illustrating formation of the insulating film 44 in the withstanding voltage structure portion 62. This formation corresponds to formation of the insulating film 44 (step S3 of FIG. 3). Because the coatability of the insulating film 44 is affected by the roughness of the base, the insulating film 44 may have a concave portion in a portion directly above the trench 48. Although this example showed an example of forming the field limiting ring 36 below the trench 48, one or more of the junction barrier region 32, the electric field relaxation region 34, and the field limiting ring 36 may be formed below the trench 48.

Figure 8:
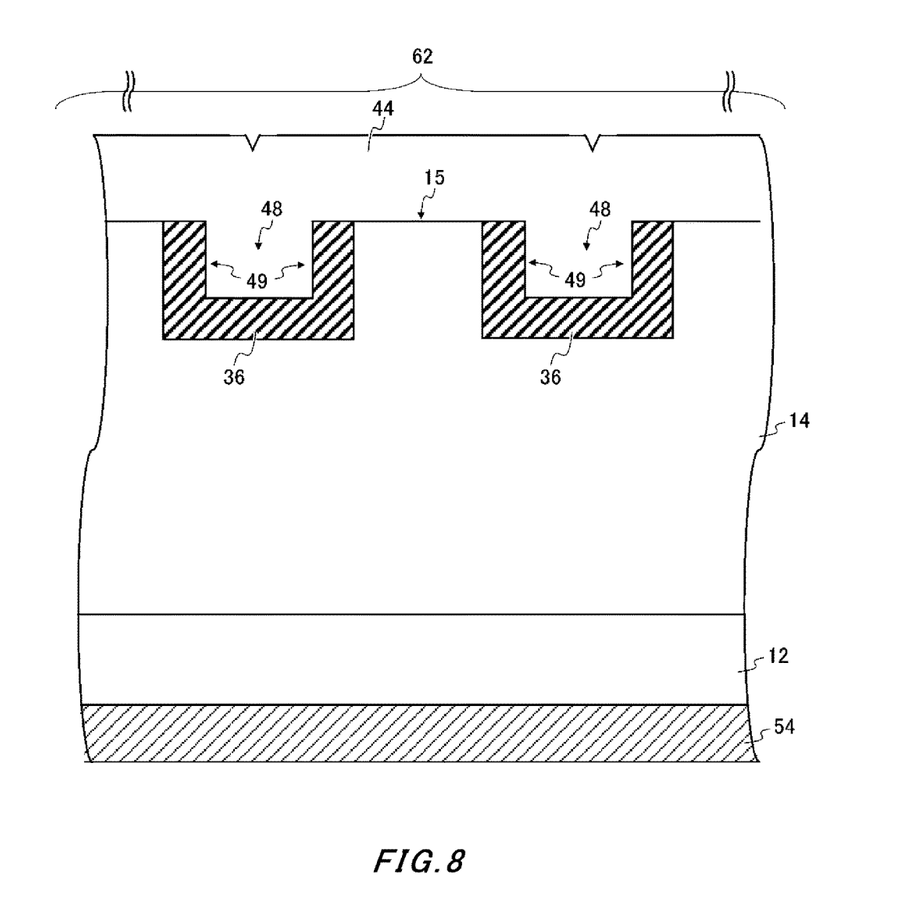
FIG. 8 is a view illustrating another example of the trench 48.

FIG. 8 is a view illustrating another example of the trench 48. The trench 48 of this example is formed such that the side wall 49 of the trench 48 and the front surface 15 of the drift layer 14 form an angle of 90 degrees. The trench 48 of this example also has a depth of 1 μm from the front surface 15 of the drift layer 14 to the bottom of the trench 48. The field limiting ring 36 of this example may be formed by inclining the direction of laser irradiation with respect to the drift layer 14, and irradiating the drift layer 14 with laser multiple times. Also, in this example, it is possible to form the depletion layer at a deeper position compared to the first and second embodiments. Therefore, it is possible to obtain a higher electric field shielding effect and a higher electric field relaxing effect compared to the first and second embodiments.

In the embodiments of the present specification, the first conductivity-type is an n-type, and the second conductivity-type is a p-type. However, in another example, the first conductivity-type may be a p-type, and the second conductivity-type may be an n-type.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

10 . . . central portion, 11 . . . end portion, 12 . . . SiC substrate, 14 . . . drift layer, 15 . . . front surface, 16 . . . contact region, 18 . . . outer circumferential portion, 20 . . . mask layer, 21 . . . opening, 22 . . . laser, 24 . . . Al layer, 30 . . . electric field control region, 32 . . . junction barrier region, 34 . . . electric field relaxation region, 36 . . . field limiting ring, 38 . . . channel stopper region, 42 . . . Schottky electrode, 43 . . . ohmic electrode, 44 . . . insulating film, 46 . . . channel stopper electrode, 47 . . . field plate electrode, 48 . . . trench, 49 . . . side wall, 52 . . . anode electrode, 54 . . . cathode electrode, 56 . . . overlapping region, 60 . . . active portion, 62 . . . withstanding voltage structure portion, 100 . . . SiC-SBD, 110 . . . SiC-SBD, 200 . . . manufacturing flow

What is claimed is:

1. A method of manufacturing a silicon carbide semiconductor device, comprising:
forming, on one main surface of a first conductivity-type silicon carbide substrate, a first conductivity-type drift layer having a lower concentration than that of the silicon carbide substrate;
forming, on a front surface side of the drift layer, a second conductivity-type electric field control region by a laser doping technology, the second conductivity-type electric field control region including (i) a ring-shaped electric field relaxation region formed at an outer circumferential portion in a region where the drift layer and a Schottky electrode contact with each other and (ii) a plurality of junction barrier regions selectively formed on an inner circumferential side of the electric field relaxation region;
forming the Schottky electrode in contact with the drift layer; and
forming, on another main surface of the silicon carbide substrate, a cathode electrode,
forming an ohmic electrode which has an ohmic connection to the plurality of selectively formed junction barrier regions; and
forming an anode electrode in direct contact with the Schottky electrode and the ohmic electrode after the formation of the ohmic electrode.

2. The method according to claim 1, wherein the Schottky electrode and the ohmic electrode are the same material.

3. The method according to claim 1, wherein the ohmic electrode and the anode electrode are the same material.

4. The method according to claim 1, wherein the formation of the second conductivity-type electric field control region by the laser doping technology comprises:
forming a mask layer having a plurality of openings on the drift layer; and
implanting aluminum into the drift layer through the plurality of openings by irradiating the drift layer with a laser in a state where the drift layer is exposed to a gas containing aluminum.

5. The method according to claim 4, wherein the formation of the second conductivity-type electric field control region by the laser doping technology further comprises removing the plurality of patterns.

6. The method according to claim 1, wherein a laser light source in the laser doping technology in the formation of the electric field control region is any of KrF, ArF, XeF, XeCl, and YAG3ω.

7. A method of manufacturing a silicon carbide semiconductor device, comprising:
forming, on one main surface of a first conductivity-type silicon carbide substrate, a first conductivity-type drift layer having a lower concentration than that of the silicon carbide substrate;
forming, on a front surface side of the drift layer, a second conductivity-type electric field control region by a laser doping technology, the second conductivity-type electric field control region including (i) a ring-shaped electric field relaxation region formed at an outer circumferential portion in a region where the drift layer and a Schottky electrode contact with each other (ii) one or more field limiting rings provided on an outer circumferential side of the ring-shaped electric field relaxation region and (iii) a ring-shaped channel stopper region provided on an outer circumferential side of the one or more field limiting rings,
forming the Schottky electrode in contact with the drift layer;
forming, on another main surface of the silicon carbide substrate, a cathode electrode;
forming an insulating film in contact with the drift layer;
forming a channel stopper electrode in contact with the channel stopper region and the insulating film after the formation of the insulating film; and forming an anode electrode in contact with the Schottky electrode after the formation of the Schottky electrode, wherein a region between the channel stopper electrode and the anode electrode is covered by the insulating film.

8. The method according to claim 7, further comprising forming a field plate electrode connected to the one or more field limiting rings.

9. The method according to claim 7, wherein the formation of the second conductivity-type electric field control region by the laser doping technology comprises:

forming a mask layer having a plurality of openings on the drift layer; and implanting aluminum into the drift layer through the plurality of openings by irradiating the drift layer with a laser in a state where the drift layer is exposed to a gas containing aluminum.

10. The method according to claim 9, wherein the formation of the second conductivity-type electric field control region by the laser doping technology further comprises removing the plurality of patterns.

11. The method according to claim 7, wherein a laser light source in the laser doping technology in the formation of the electric field control region is any of KrF, ArF, XeF, XeCl, and YAG3ω.

12. The method according to claim 7, further comprising forming one or more trenches after the formation of the first conductivity-type drift layer and before the formation of the electric field control region, wherein the one or more field limiting rings are formed below the one or more trenches.

13. A method of manufacturing a silicon carbide semiconductor device, comprising:

forming, on one main surface of a first conductivity-type silicon carbide substrate, a first conductivity-type drift layer having a lower concentration than that of the silicon carbide substrate;

forming, on a front surface side of the drift layer, a second conductivity-type electric field control region by a laser doping technology;

forming a Schottky electrode in contact with the drift layer; and forming, on another main surface of the silicon carbide substrate, a cathode electrode, wherein the formation of the second conductivity-type electric field control region by the laser doping technology comprises:

depositing an aluminum layer onto the drift layer;

forming a plurality of patterns by patterning the aluminum layer; and implanting aluminum into the drift layer through the plurality of patterns by irradiating the plurality of patterns with a laser.

14. The method according to claim 13, wherein the formation of the second conductivity-type electric field control region by the laser doping technology further comprises removing the plurality of patterns.

15. The method according to claim 13, wherein a laser light source in the laser doping technology in the formation of the electric field control region is any of KrF, ArF, XeF, XeCl, and YAG3ω.

* * * * *